US010592247B2

United States Patent
Tanaka

(10) Patent No.: US 10,592,247 B2
(45) Date of Patent: Mar. 17, 2020

(54) ARITHMETIC CIRCUIT AND CONTROL METHOD WITH FULL ELEMENT PERMUTATION AND ELEMENT CONCATENATE SHIFT LEFT

(71) Applicant: FUJITSU LIMITED, Kawasaki-shi, Kanagawa (JP)

(72) Inventor: Tomonori Tanaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 543 days.

(21) Appl. No.: 14/833,602

(22) Filed: Aug. 24, 2015

(65) Prior Publication Data

US 2016/0103680 A1    Apr. 14, 2016

(30) Foreign Application Priority Data

Oct. 8, 2014  (JP) .................................. 2014-207364

(51) Int. Cl.
| | | |
|---|---|---|
| *G06F 9/34* | (2018.01) | |
| *G06F 9/315* | (2018.01) | |
| *G06F 7/57* | (2006.01) | |
| *G06F 9/30* | (2018.01) | |
| *H03K 19/173* | (2006.01) | |

(Continued)

(52) U.S. Cl.
CPC ................ *G06F 9/34* (2013.01); *G06F 7/57* (2013.01); *G06F 9/3001* (2013.01); *G06F 9/30018* (2013.01); *G06F 9/30032* (2013.01); *G06F 9/30036* (2013.01); *G06F 9/30145* (2013.01); *G06F 9/3887* (2013.01); *H03K 19/1737* (2013.01); *G06F 7/76* (2013.01)

(58) Field of Classification Search
CPC .... G06F 9/30003; G06F 9/30032; G06F 9/34; G06F 9/3887
See application file for complete search history.

(56) References Cited

U.S. PATENT DOCUMENTS

| | | | |
|---|---|---|---|
| 7,716,264 B2* | 5/2010 | Dance | G06F 5/01 708/209 |
| 2009/0083519 A1* | 3/2009 | Yang | G06F 7/483 712/36 |

(Continued)

FOREIGN PATENT DOCUMENTS

| | | |
|---|---|---|
| JP | 2002-229962 | 8/2002 |
| WO | 02/071246 | 9/2002 |

OTHER PUBLICATIONS

Extended European Search Report dated Sep. 29, 2016 for corresponding European Patent Application No. 15182753.2, 13 pages.

*Primary Examiner* — David J. Huisman
(74) *Attorney, Agent, or Firm* — Fujitsu Patent Center

(57) ABSTRACT

An arithmetic circuit comprises first to N-th, N being an integer equal to or larger than two, element circuits respectively including: input circuits which input first operand data and second operand data; and element data selectors which select operand data of any one of the element circuits on the basis of a request element signal; and a data bus which supplies the operand data from the input circuits to the element data selectors. When a control signal is in a first state, the element data selectors select, on the basis of the request element signal included in the second operand data, the first operand data of any of the element circuits and output the first operand data.

6 Claims, 17 Drawing Sheets

(51) Int. Cl.
*G06F 9/38* (2018.01)
*G06F 7/76* (2006.01)

(56) References Cited

U.S. PATENT DOCUMENTS

2010/0174891 A1* 7/2010 Nomoto ............... G06F 9/3885
  712/222
2011/0185151 A1* 7/2011 Whitaker ............ G06F 15/8015
  712/22

* cited by examiner

FIG.8A

SHIFT DATA (NUMBERS IN PARENTHESES ARE OP2)

|  |  | element#[1:0] | | | |
|---|---|---|---|---|---|
|  |  | 0 | 1 | 2 | 3 |
| shc [1:0] | 0 | 0 | 1 | 2 | 3 |
| | 1 | 1 | 2 | 3 | (0) |
| | 2 | 2 | 3 | (0) | (1) |
| | 3 | 3 | (0) | (1) | (2) |

FIG.8B

BORROW VALUE (0:op1, 1:op2)

|  |  | element#[1:0] | | | |
|---|---|---|---|---|---|
|  |  | 0 | 1 | 2 | 3 |
| shc [1:0] | 0 | 0 | 0 | 0 | 0 |
| | 1 | 1 | 0 | 0 | 0 |
| | 2 | 1 | 1 | 0 | 0 |
| | 3 | 1 | 1 | 1 | 0 |

FIG.8C

SUM [1:0]

|  |  | element#[1:0] | | | |
|---|---|---|---|---|---|
|  |  | 0 | 1 | 2 | 3 |
| shc [1:0] | 0 | 00 | 01 | 10 | 11 |
| | 1 | 01 | 10 | 11 | 00 |
| | 2 | 10 | 11 | 00 | 01 |
| | 3 | 11 | 00 | 01 | 10 |

FIG.11A
LOGICAL VALUE TABLE OF DECODER WITH RESPECT TO ELEMENT#0

| validity ||||  cmpr0[2:0] ||
| el#0 | el#1 | el#2 | el#3 | [2] | [1:0] |
| --- | --- | --- | --- | --- | --- |
| 1 | x | x | x | 0 | 0 0 |
| 0 | 1 | x | x | 0 | 0 1 |
| 0 | 0 | 1 | x | 0 | 1 0 |
| 0 | 0 | 0 | 1 | 0 | 1 1 |
| default |||| 1 | x x |

FIG.11B
LOGICAL VALUE TABLE OF DECODER WITH RESPECT TO ELEMENT#1

| validity |||| cmpr1[2:0] ||
| el#0 | el#1 | el#2 | el#3 | [2] | [1:0] |
| --- | --- | --- | --- | --- | --- |
| 1 | 1 | x | x | 0 | 0 1 |
| 1 | 0 | 1 | x | 0 | 1 0 |
| 1 | 0 | 0 | 1 | 0 | 1 1 |
| 0 | 1 | 1 | x | 0 | 1 0 |
| 0 | 1 | 0 | 1 | 0 | 1 1 |
| 0 | 0 | 1 | 1 | 0 | 1 1 |
| default |||| 1 | x x |

FIG.11C
LOGICAL VALUE TABLE OF DECODER WITH RESPECT TO ELEMENT#2

| validity |||| cmpr2[2:0] ||
| el#0 | el#1 | el#2 | el#3 | [2] | [1:0] |
| --- | --- | --- | --- | --- | --- |
| 1 | 1 | 1 | x | 0 | 1 0 |
| 1 | 1 | 0 | 1 | 0 | 1 1 |
| 1 | 0 | 1 | 1 | 0 | 1 1 |
| 0 | 1 | 1 | 1 | 0 | 1 1 |
| default |||| 1 | x x |

FIG.11D
LOGICAL VALUE TABLE OF DECODER WITH RESPECT TO ELEMENT#3

| validity |||| cmpr3[2:0] ||
| el#0 | el#1 | el#2 | el#3 | [2] | [1:0] |
| --- | --- | --- | --- | --- | --- |
| 1 | 1 | 1 | 1 | 0 | 1 1 |
| default |||| 1 | x x |

ARITHMETIC CIRCUIT AND CONTROL METHOD WITH FULL ELEMENT PERMUTATION AND ELEMENT CONCATENATE SHIFT LEFT

CROSS-REFERENCE TO RELATED APPLICATION

This application is based upon and claims the benefit of priority of the prior Japanese Patent Application No. 2014-207364, filed on Oct. 8, 2014, the entire contents of which are incorporated herein by reference.

FIELD

The present invention relates to an arithmetic circuit and a control method with full element permutation and element concatenate shift left.

BACKGROUND

The development of processors enabling high-speed arithmetic processing has been actively promoted. A processor mounted on an information processing apparatus that performs high-performance calculation adopts various techniques for increasing the speed of arithmetic processing. As a technique for increasing the speed of the arithmetic processing by performing a plurality of kinds of processing in parallel, there is a single instruction multiple data (SIMD) processing system for simultaneously executing the same arithmetic processing on a plurality of data in parallel with one command.

An SIMD processor includes a plurality of SIMD arithmetic elements and executes one command on a plurality of data in parallel. In particular, in processors in recent years, the number of SIMD arithmetic elements tends to be increased for a further increase in speed.

In the case of simple processing that includes decoding one command, inputting processing target data of the command to the plurality of SIMD arithmetic elements, and performing arithmetic processing of the data in parallel, the SIMD processor attains high-speed arithmetic processing by performing decoding of a single command and parallel arithmetic processing of a plurality of data. The SIMD is disclosed in Japanese Laid-open Patent Publication No. 2002-229962.

However, when the simple processing is not performed, for example, when an arithmetic results generated by the SIMD arithmetic elements is subjected to arithmetic processing by other SIMD arithmetic elements, exchange and distribution of data among the SIMD arithmetic elements need to be performed. The efficiency of the arithmetic processing is sometimes decreased. Therefore, an inter-element arithmetic circuit that performs data exchange and the like among the plurality of SIMD arithmetic elements is demanded.

However, according to an increase in SIMD width of the SIMD processor, a large number of SIMD arithmetic elements such as four, eight, or sixteen SIMD arithmetic elements are mounted on an integrated circuit substrate of an arithmetic processing apparatus. Therefore, in the inter-element arithmetic circuit, data wiring needs to be provided in a wide range on the integrated circuit substrate. Therefore, the circuit size of the inter-element arithmetic circuit increases.

SUMMARY

An arithmetic circuit comprises:
first to N-th, N being an integer equal to or larger than three, element circuits each of which includes:
  input circuits configured to input first operand data and second operand data; and
  an element data selector (S1) configured to select the first operand data or the second operand data of any one of the first to N-th element circuits on the basis of a request element signal (want_el[1:0]); and
a data bus (DB), provided in common to the first to N-th element circuits, configured to supply the first operand data or the second operand data input by the first to N-th element circuits to the element data selectors (S1) of the first to N-th element circuits, wherein:
each of the first to N-th element circuits has corresponding element number (element #[1:0]),
each of the first to N-th element circuits includes:
  an operand selector (S3) configured to:
    select, when a control signal is in a first state, the first operand data to output to the data bus, and
    select, when the control signal is in a second state, on the basis of an operand switch signal (op_switch) that indicates whether or not a shift amount (shc_[1:0]), which is common for the first to N-th element circuits, is larger than the corresponding element number (element #[1:0]), the first operand data or the second operand data to output to the data bus, and
the element data selector (S1) in each of the first to N-th element circuits:
  selects, when the control signal is in the first state, on the basis of a first request element signal (op2[1:0]) included in the second operand data, the first operand data of any one of the first to N-th element circuits, and
  selects, when the control signal is in the second state, on the basis of a second request element signal (sum[1:0]) that is generated by adding the element number (element #[1:0]) to the shift amount (shc[1:0]), the first operand data or the second operand data selected by the operand selector (S3) of any one of the first to N-th element circuits.

According to the first aspect, it is possible to suppress a circuit size and perform various inter-element arithmetic operations.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 8A to 8C are logical value tables for explaining the operation of the adders CSL_Adder.

FIGS. 11A to 11D are diagram depicting logical value tables of the compress decoder Compress.

DESCRIPTION OF EMBODIMENTS

Overview of an Embodiment

Figure 1:
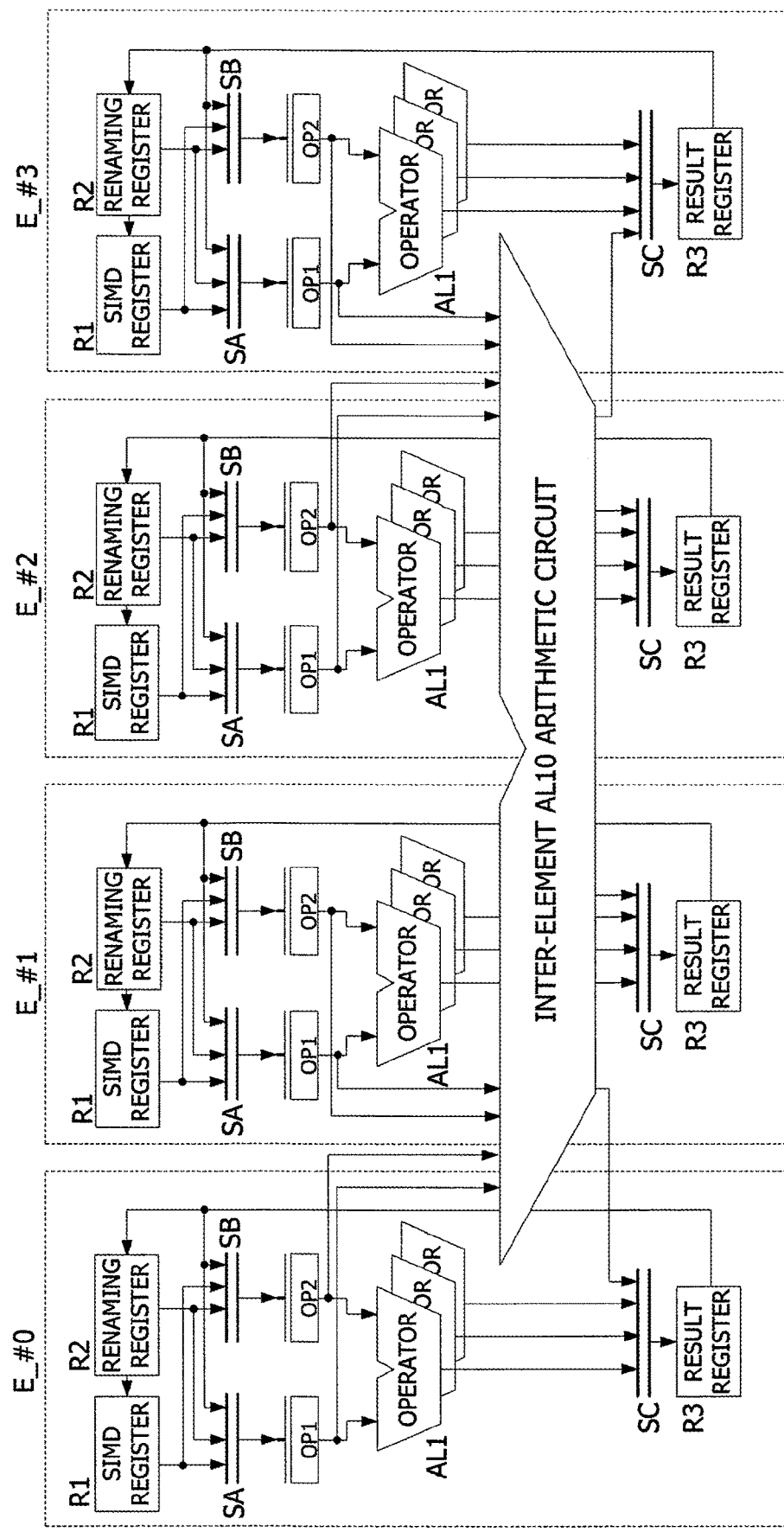
FIG. 1 is a diagram depicting an arithmetic circuit and an SIMD operator in an embodiment.

FIG. 1 is a diagram depicting an arithmetic circuit and an SIMD operator in an embodiment. In FIG. 1, a four-SIMD operator provided in a processor is depicted. The four-SIMD operator includes four SIMD arithmetic elements $E\_\#0$, $E\_\#1$, $E\_\#2$, and $E\_\#3$ respectively including operators AL1. As an example, SIMD width is set to four (four SIMDs). The SIMD operator includes at least two SIMD arithmetic elements. The SIMD operator may be, for example, an eight-SIMD operator including eight SIMD arithmetic elements or may be a sixteen-SIMD operator.

The SIMD arithmetic elements $E\_\#0$ to $E\_\#3$ include first and second operand registers OP1 and OP2 that retain first and second operand data, operators AL1 that receive inputs of the first and second operand data and perform an arithmetic operation, result registers R3 that retain arithmetic operation results of the operators AL1, renaming registers R2 that retain data retained by the result registers R3, and SIMD registers R1 that retain data retained by the renaming registers R2.

The SIMD arithmetic elements further include, at the pre-stage of the first and second operand registers OP1 and OP2, two kinds of selectors SA and SB that select any one of the result registers R3, the renaming registers R2, and the SIMD registers R1 and selectors SC that select outputs of a plurality of operators AL1. Data forwarding from the result registers R3 to other parts is also conceivable. However, the data forwarding is not referred to in this embodiment.

Operand data of the first and second operand registers OP1 and OP2 are, for example, 64 bits. Similarly, the SIMD registers R1, the renaming registers R2, and the result registers R3 also have 64-bit width. However, this embodiment is not limited to the 64-bit width.

An SIMD command entered in a reservation station (not-depicted) is input to a plurality of SIMD arithmetic elements. The operators AL1 in the plurality of SIMD elements perform an arithmetic operation of a plurality of pairs of first and second operand data respectively and store arithmetic operation result in the respective result registers R3. The renaming registers R2 are registers that temporarily retain data such that the operators AL1 perform an arithmetic operation of a plurality of commands out-of-order respectively and output the commands in in-order.

The processor includes an inter-element arithmetic circuit AL10 provided to traverse the four SIMD arithmetic elements $E\_\#0$ to $E\_\#3$. The arithmetic circuit AL10 receives inputs of the first and second operand data in the first and second operand registers OP1 and OP2 in the SIMD arithmetic elements $E\_\#0$ to $E\_\#3$ and executes, for example, an arithmetic operation explained below. The arithmetic circuit AL10 performs, for example, (1) inter-element data replacement (element permutation), (2) element concatenating left shift (element concatenate shift left) for concatenating data of elements and shifting the data to the left, (3) element addition mask (element sum mask) for adding up data of elements, and (4) element data compression (element compressing) for compressing and arranging data of elements. An arithmetic operation result of the arithmetic circuit AL10 is output to the result registers R3 in the SIMD arithmetic elements.

As explained above, the inter-element arithmetic circuit AL10 performs basic arithmetic processing such as rearrangement of data among the four SIMD arithmetic elements, masking of data of any element, and broadcast for distributing data of any element to all the elements. In addition, the inter-element arithmetic circuit AL10 also performs an addition operation, special rearrangement processing, and the like for the data of the elements. Therefore, the inter-element arithmetic circuit AL10 makes the most of advantages of high-speed parallel processing by the SIMD operator including two or more SIMD arithmetic elements.

Figure 2:
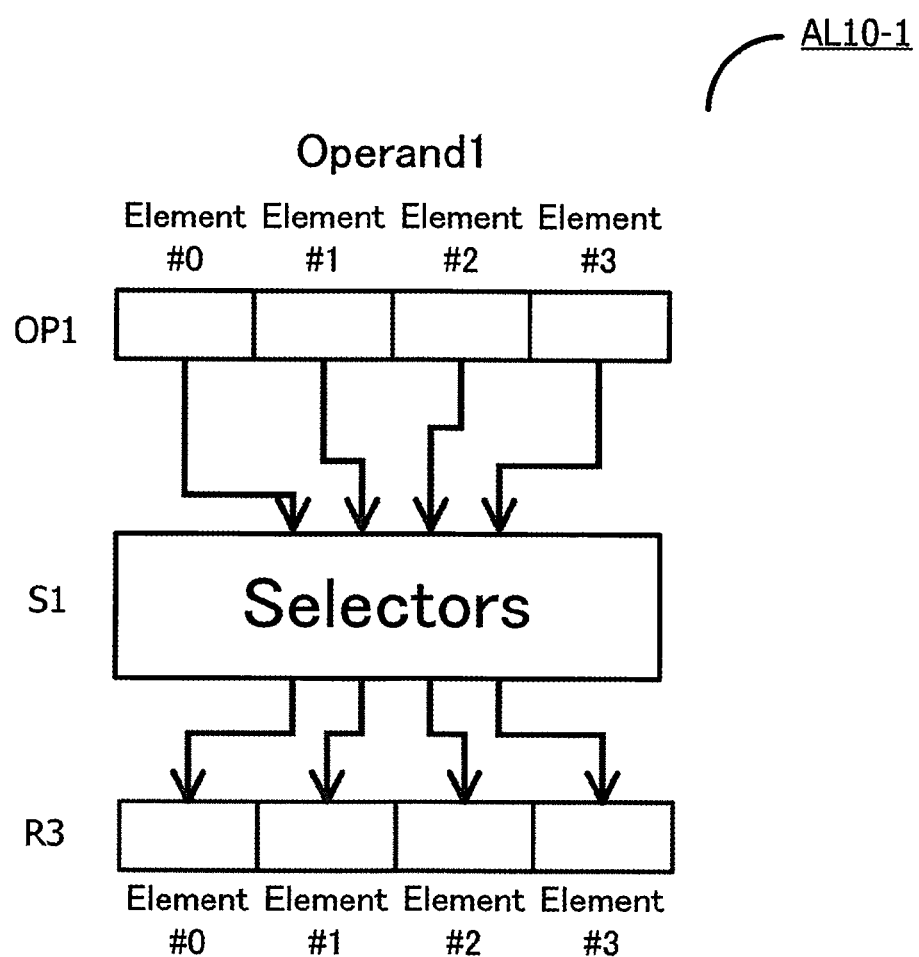
FIG. 2 is a diagram depicting an example of an arithmetic circuit of a full element permutation in this embodiment.

FIG. 2 is a diagram depicting an example of an arithmetic circuit of a full element permutation in this embodiment. An arithmetic circuit AL10-1 includes selectors S1 that select any one of data stored in the first operand registers OP1 of the four SIMD arithmetic elements $E\_\#0$ to $E\_\#3$ and output the data to any one of the result registers R3 of the four SIMD arithmetic elements. For example, the selectors S1 are provided to correspond to the respective four SIMD arithmetic elements and output the selected data to the respective result registers R3. Selection signals of the selectors S1 may be included in, for example, the second operand data in the second operand registers OP2. A data bus for data transfer is needed between the first operand registers OP1 and inputs of the selectors S1 of the four SIMD arithmetic elements.

Since the selectors S1 are provided, the arithmetic circuit AL10-1 performs rearrangement of data among the SIMD arithmetic elements and broadcast for distributing data of any SIMD arithmetic element to all the SIMD arithmetic elements.

Further, as explained below, by providing mask selectors that select outputs of the selectors S1 or all-zero data, data of any SIMD arithmetic element can be masked to the all-zero data.

Figure 3:
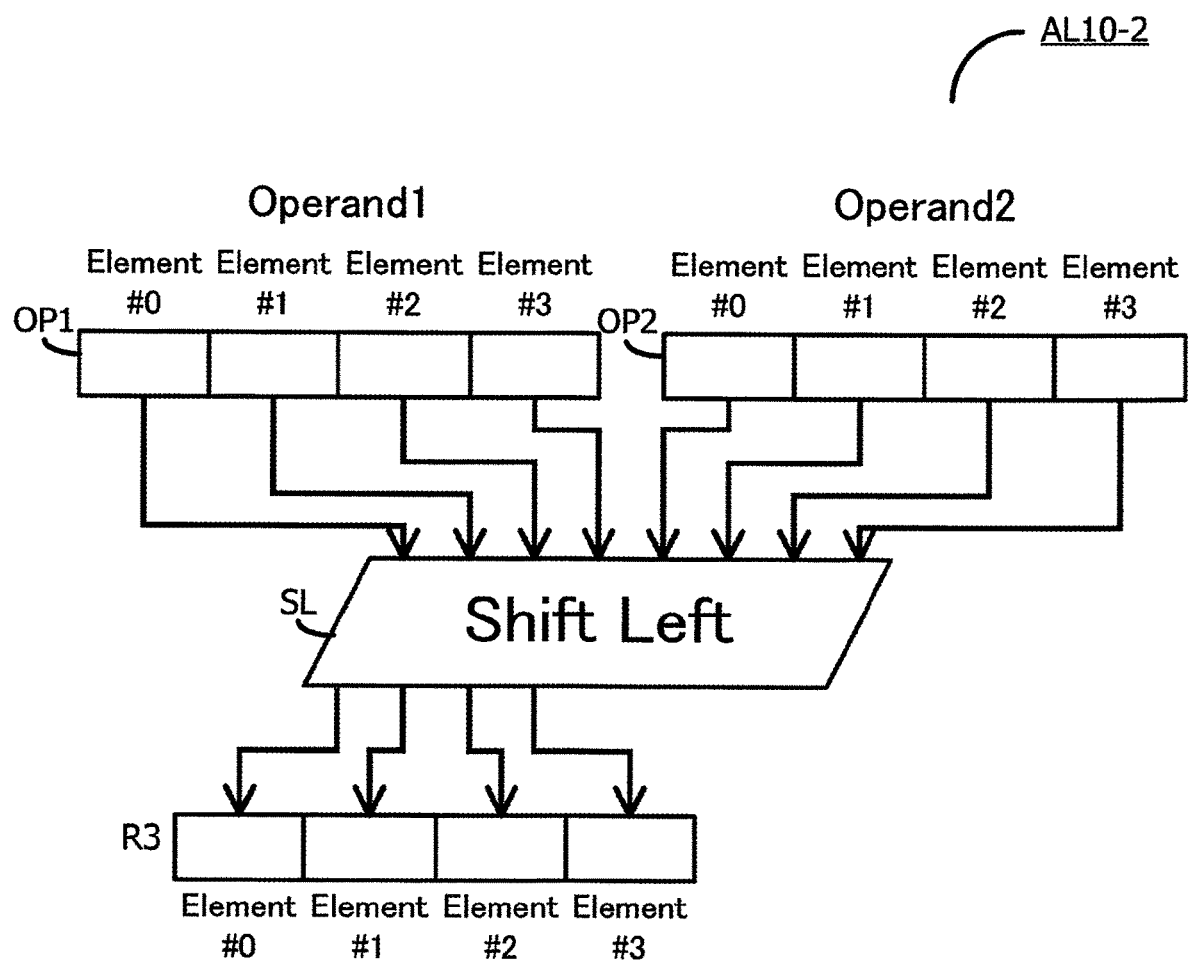
FIG. 3 is a diagram depicting an example of an arithmetic circuit of element concatenate shift left in this embodiment.

FIG. 3 is a diagram depicting an example of an arithmetic circuit of element concatenate shift left in this embodiment. This arithmetic circuit AL10-2 shifts the number of data equivalent to the number of elements×2, which is obtained by combining two operand data of each of the SIMD arithmetic elements, to the left by any number of elements and stores the data in the result registers R3 of the SIMD arithmetic elements in the order of element numbers from a high order side.

The arithmetic circuit AL10-2 includes a shift left circuit SL that shifts data of the first operand registers OP1 and the data of the second operand registers OP2 of the SIMD arithmetic element to the left by any shift amount in a state in which the data are combined. An output of the shift left circuit SL is stored in the result registers R3 of the four SIMD arithmetic elements in order. Data of a shift amount (not-depicted) is supplied to the shift left circuit SL.

For example, when the shift amount is 2, the arithmetic circuit AL10-2 transfers first operand data of an element #2, first operand data of an element #3, second operand data of an element #0, and second operand data of an element #1 respectively to the result registers R3 of the elements #0 to #3.

In the arithmetic circuit AL10-2, the shift left circuit SL and a data bus that supplies data from the first and second operand registers of the SIMD arithmetic elements E_#0 to E_#3 to the shift left circuit SL are needed. In particular, since the four SIMD arithmetic elements are disposed in a wide region on the integrated circuit board, the data bus increases mounting costs of circuits. In this embodiment, by adding a slight circuit to the full element permutation arithmetic circuit AL10-1, the element concatenate shift left arithmetic circuit AL10-2 is realized.

Figure 4:
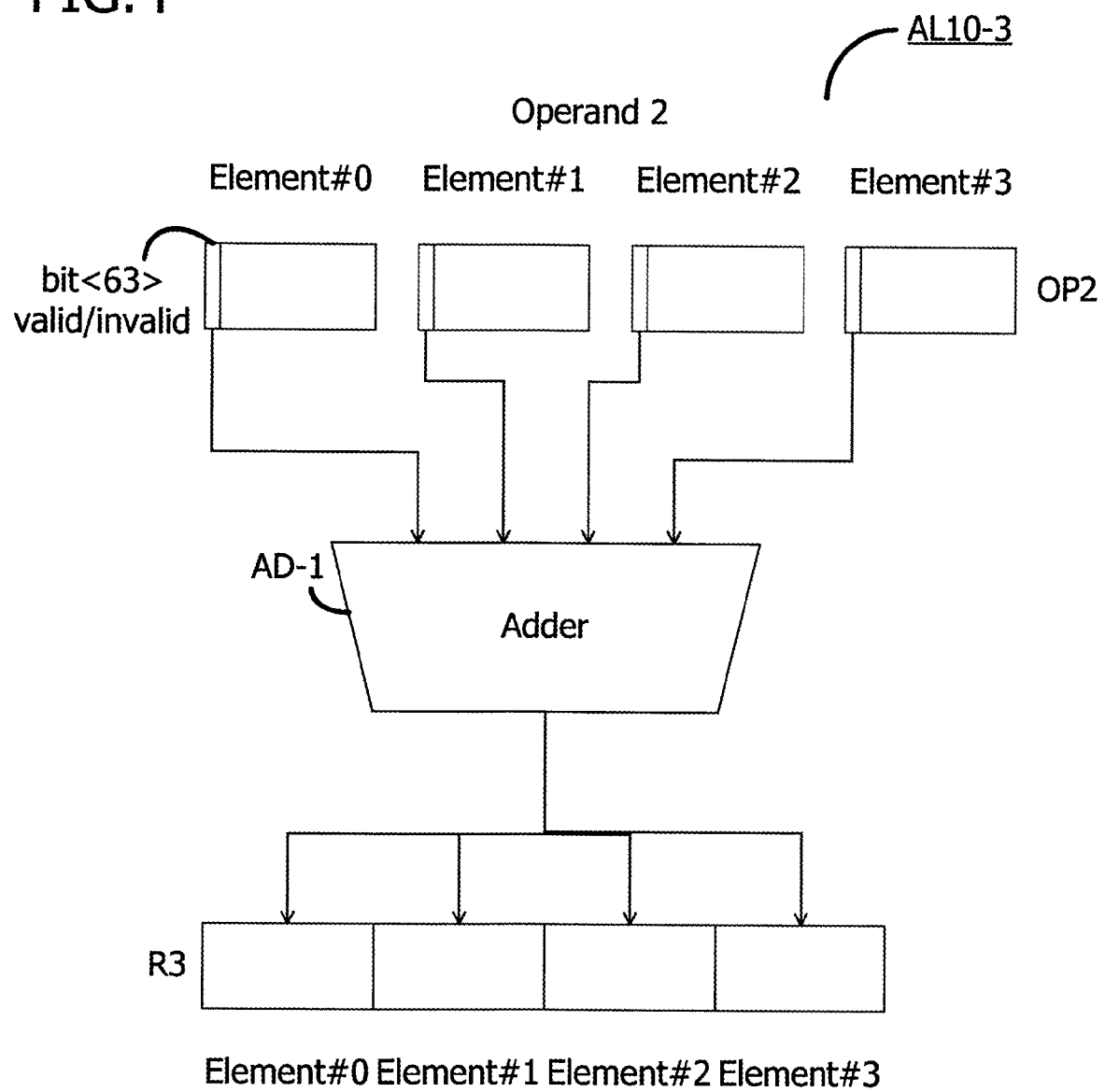
FIG. 4 is a diagram depicting an example of an arithmetic circuit of an element sum mask in this embodiment.

FIG. 4 is a diagram depicting an example of an arithmetic circuit of an element sum mask in this embodiment. This arithmetic circuit AL10-3 counts valid data of 1 bit indicating whether respective elements are valid and stores the number of valid elements, which is a count value, in the result registers R3 of all the SIMD arithmetic elements. Alternatively, the arithmetic circuit AL10-3 may store the number of valid elements in the result registers R3 of the valid elements.

The arithmetic circuit AL10-3 uses, for example, 1 bit, for example, a most significant bit in the second operand data of the second operand registers OP2 of the respective elements as a valid bit. The arithmetic circuit AL10-3 includes a valid bit adder AD-1. A sum of the valid bit adder AD-1 and the number of valid elements are stored in the respective result registers R3 of all the elements.

When the arithmetic circuit AL10-3 has a function of masking by all-zero data in the result registers R3 of invalid elements, a count value of the valid bit adder AD-1 is stored in only the result registers R3 of the valid elements. All-zero data are stored in the result registers R3 of the invalid elements. In this case, a mask circuit of the full element permutation arithmetic circuit AL10-1 is used.

Figure 5:
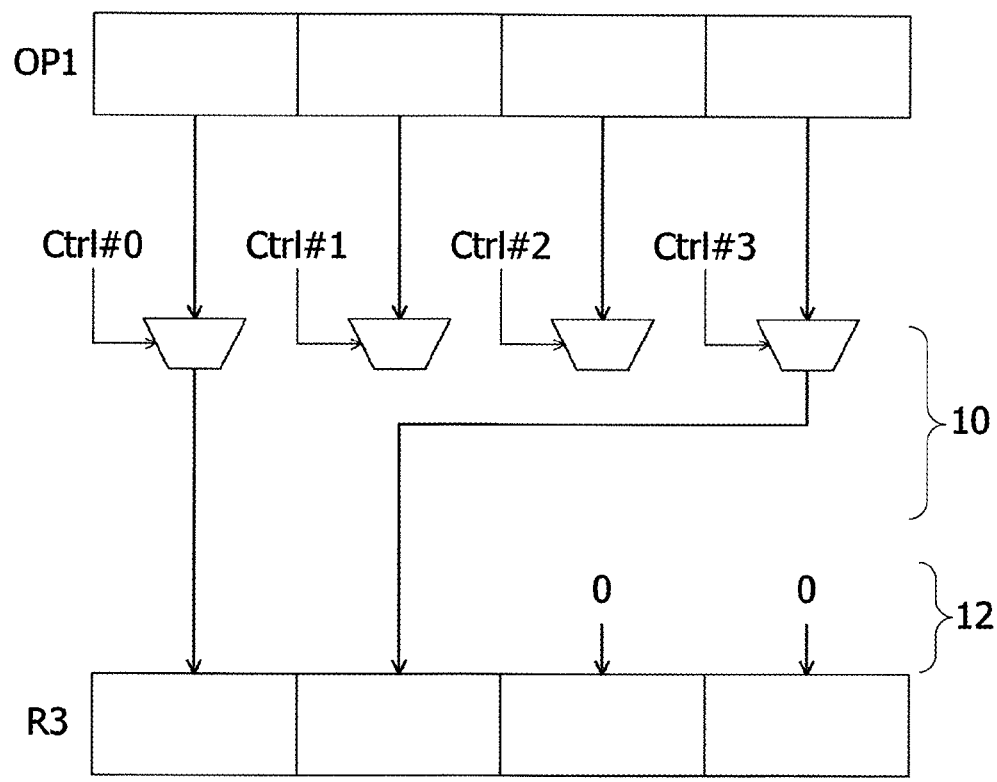
FIG. 5 is a diagram depicting an example of an arithmetic circuit of element compress in this embodiment.

FIG. 5 is a diagram depicting an example of an arithmetic circuit of element compress in this embodiment. This arithmetic circuit AL10-4 receives the operand data of the SIMD arithmetic elements and inputs of control signals Ctrl #0 to Ctrl #3 indicating whether the operand data are used, combines the operand data of elements, to which the control signals indicate valid, and stores the operand data in the respective result registers R3 in order of element numbers from the element #0 on the left side, that is, in a left-aligned state.

In the example depicted in FIG. 5, the control signals Ctrl #0 and Ctrl #3 are valid, the control signals Ctrl #1 and Ctrl #2 are invalid, operand data of the elements #0 and #3 are stored in the result registers R3 of the elements #0 and #1, and all-zero data are stored in the result registers R3 of the elements #2 and #3.

The arithmetic circuit AL10-4 includes a circuit 10 that combines data of the elements, to which the control signals indicate valid, and performs shift left and a mask circuit 12 that stores all-zero data in the result registers R3 of the invalid elements. According to this embodiment, the arithmetic circuit AL10-4 is configured using the element data selectors S1 and the mask selectors (not depicted in the figure) of the full element permutation arithmetic circuit AL10-1.

Arithmetic Circuit in this Embodiment

A detailed configuration example of the four arithmetic circuits in this embodiment is explained. A configuration example of integration of the four arithmetic circuits is also explained.

[Full Element Permutation Arithmetic Circuit AL10-1]

Figure 6A:
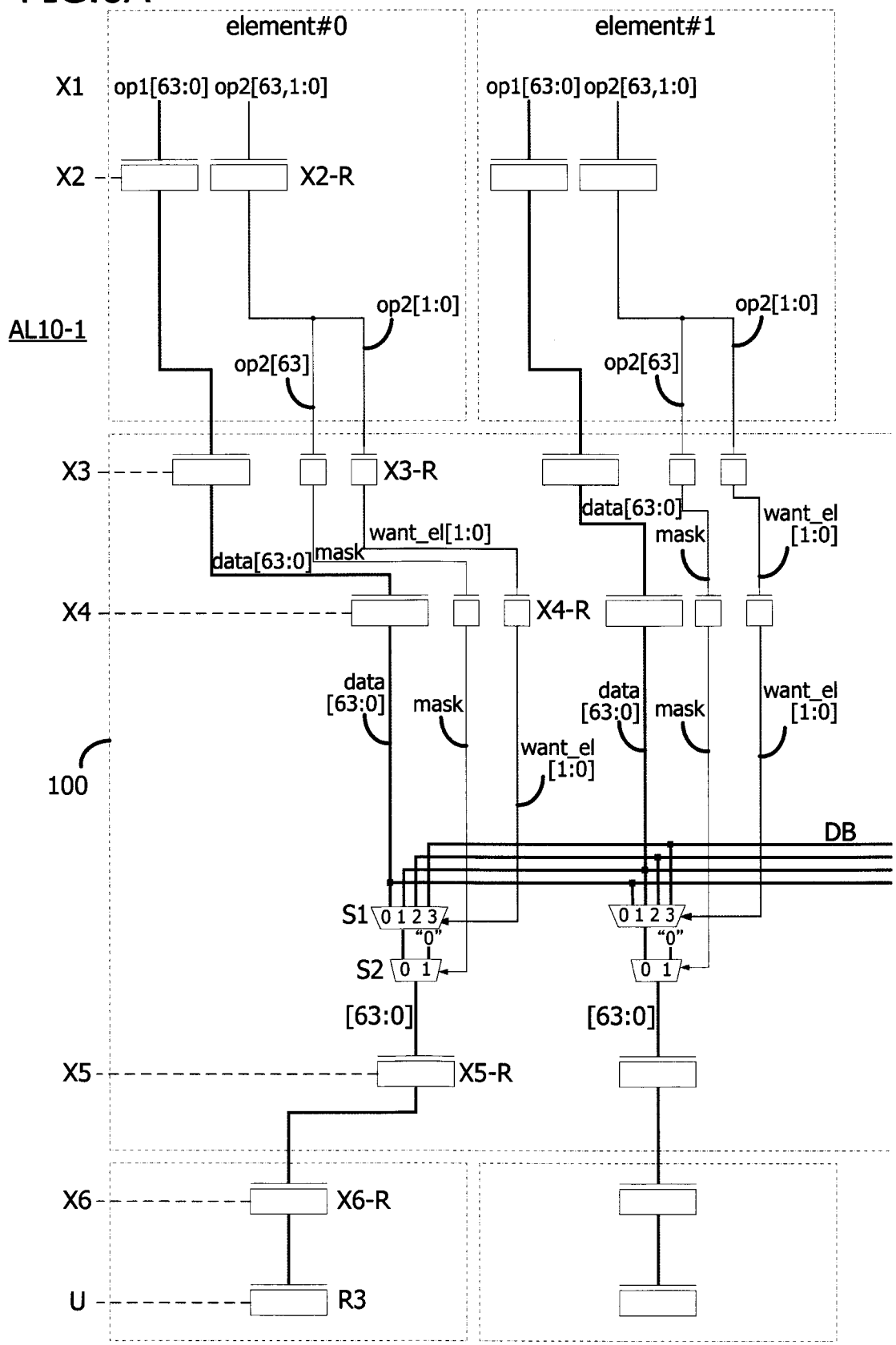
FIG. 6A is a diagram depicting the left half of the arithmetic circuit AL10-1 that performs full element permutation.
Figure 6B:
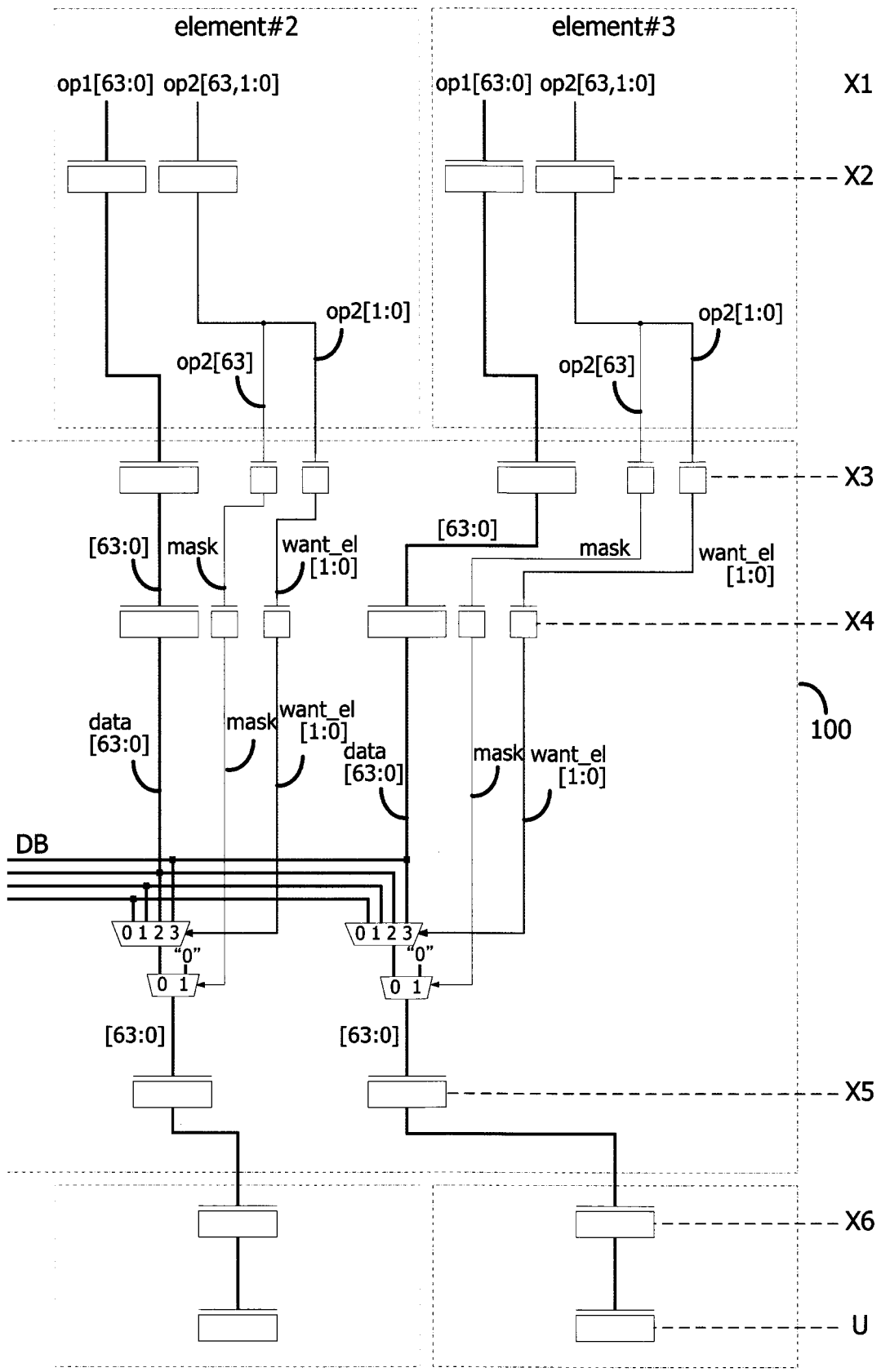
FIG. 6B is a diagram depicting the right half of the arithmetic circuit AL10-1 that performs full element permutation.

FIG. 6A is a diagram depicting the left half of the arithmetic circuit AL10-1 that performs full element permutation. FIG. 6B is a diagram depicting the right half of the arithmetic circuit AL10-1 that performs full element permutation. As explained with reference to FIG. 1, the arithmetic circuit AL10-1 is provided to traverse over the four SIMD arithmetic elements E_#0 to E_#3. The arithmetic circuit AL10-1 has the function generally explained with reference to FIG. 2.

The arithmetic circuit AL10-1 includes four element circuits element #0 to element #3 corresponding to the four SIMD arithmetic elements. Each of the element circuits include a pipeline structure of X1 to X6 and U stages. Registers are respectively provided in the X2 to X6 stages. The U stage corresponds to the result registers R3. The registers of the X2 to X6 stages are respectively referred to as X2 register X2-R to X6 register X6-R. A circuit on the left side in FIG. 6A and a circuit on the right side in FIG. 6B are symmetrical except element numbers.

The element circuits element #0 to element #3 read out, at an X1 cycle, operand data op1[63:0] and op2[63, 1:0] in the first and second operand registers in the SIMD arithmetic elements corresponding to the element circuits. Each of the element circuits transfers the first operand data op1[63:0] and a most significant bit op2[63] and least significant 2 bits op2[1:0] of the second operand data op2[63:0] to a selector section 100, which performs data exchange, via the X2 registers X2-R and the X3 registers X3-R at X2 and X3 cycles. Outputs of the X3 registers X3-R with respect to the first operand data op1[63:0] correspond to data data[63:0]. Outputs with respect to the most significant bit op2[63] and the least significant 2 bits op2[1:0] of the second operand data op2[63:0] correspond to a mask signal mask and a request element signal want_el[1:0].

The element circuits store, at an X4 cycle, the data data[63:0], the mask signal mask, and the request element signal want_el[1:0] in the X4 registers X4-R and supply the data data[63:0], the mask signal mask, and the request element signal want_el[1:0] to the element data selectors S1 and the mask selectors S2. The element circuits include, in common, a data bus DB that supplies the data data[63:0] of all the elements to inputs of the element data selectors S1 of all the element circuits. At the X4 cycle, the element data selectors S1 select data of an element requested by the request element signal want_el[1:0]. The mask selectors S2 select the selected data data[63:0] when the mask signal mask is 0, selects all-zero data "0" when the mask signal mask is 1, and outputs the data to the X5 registers X5-R.

Therefore, when the mask signal mask is 0, the data data[63:0] of the element selected by the element data selectors S1 on the basis of the request element signal want_el[1:0] is output to the X5 registers X5-R. When the mask single mask is 1, all-zero mask data "0" selected by the mask selectors S2 is output to the X5 registers X5-R.

The selected element data data[63:0] or the selected mask data "0" is stored in the X5 registers X5-R at an X5 cycle. Consequently, the selector section 100 sends the selected element data data[63:0] or the selected all-zero mask data "0" to the X6 registers X6-R in the element circuits. The sent data is stored in the X6 registers X6-R at an X6 cycle and stored in the result registers R3 at a U cycle.

As explained above, in this embodiment, as an example, the data exchanged between the SIMD arithmetic elements is input as the first operand data of the first operand registers OP1. The various control signals mask and want_el[1:0] are included in the second operand data of the second operand registers OP2 and input. When the mask function is unnecessary, the mask selectors S2 do not have to be provided in the selector section 100.

[Element Concatenate Shift Left Arithmetic Circuit AL10-2]

Figure 7A:
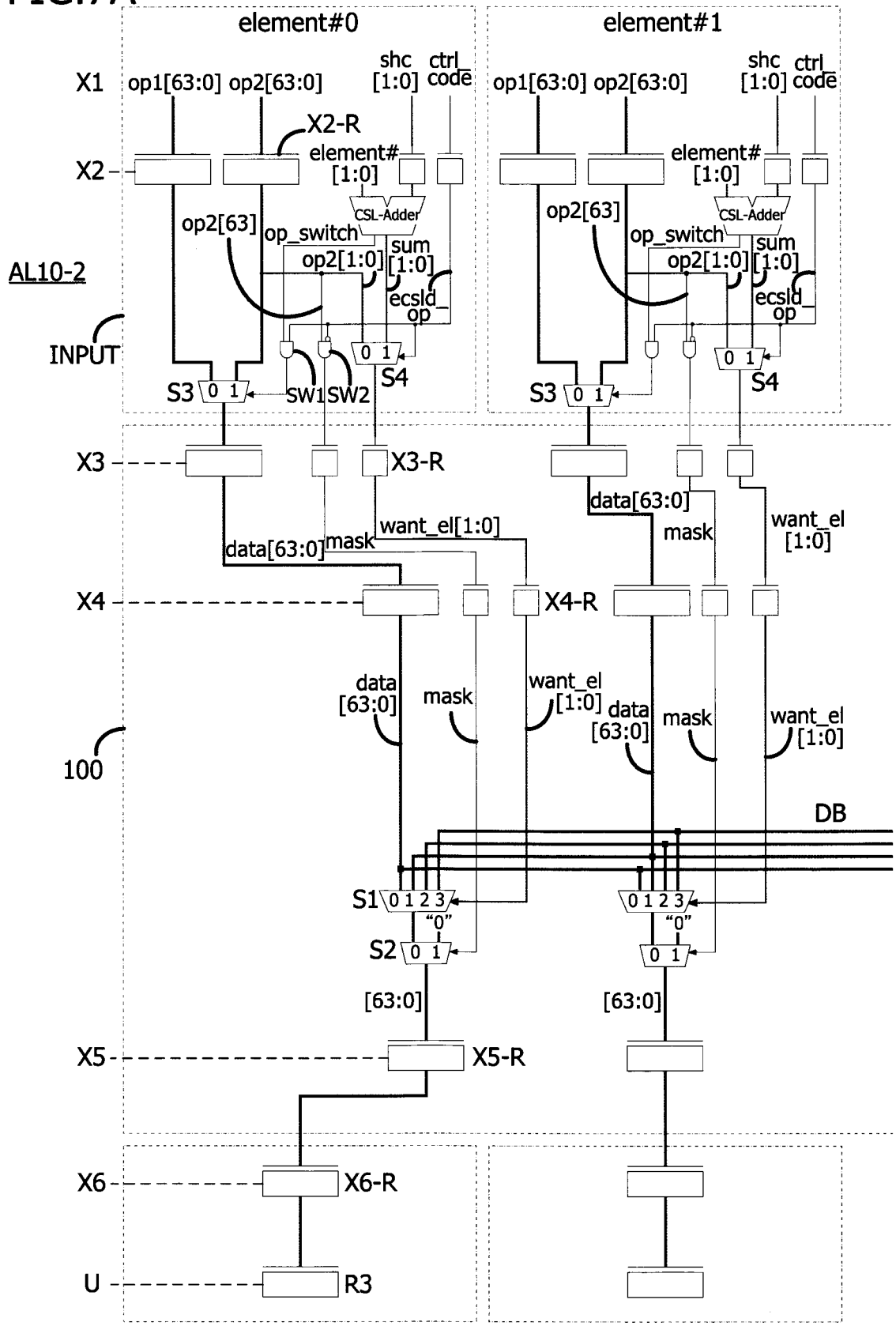
FIG. 7A is a diagram depicting the left half of the arithmetic circuit AL10-2 that performs element concatenate shift left.
Figure 7B:
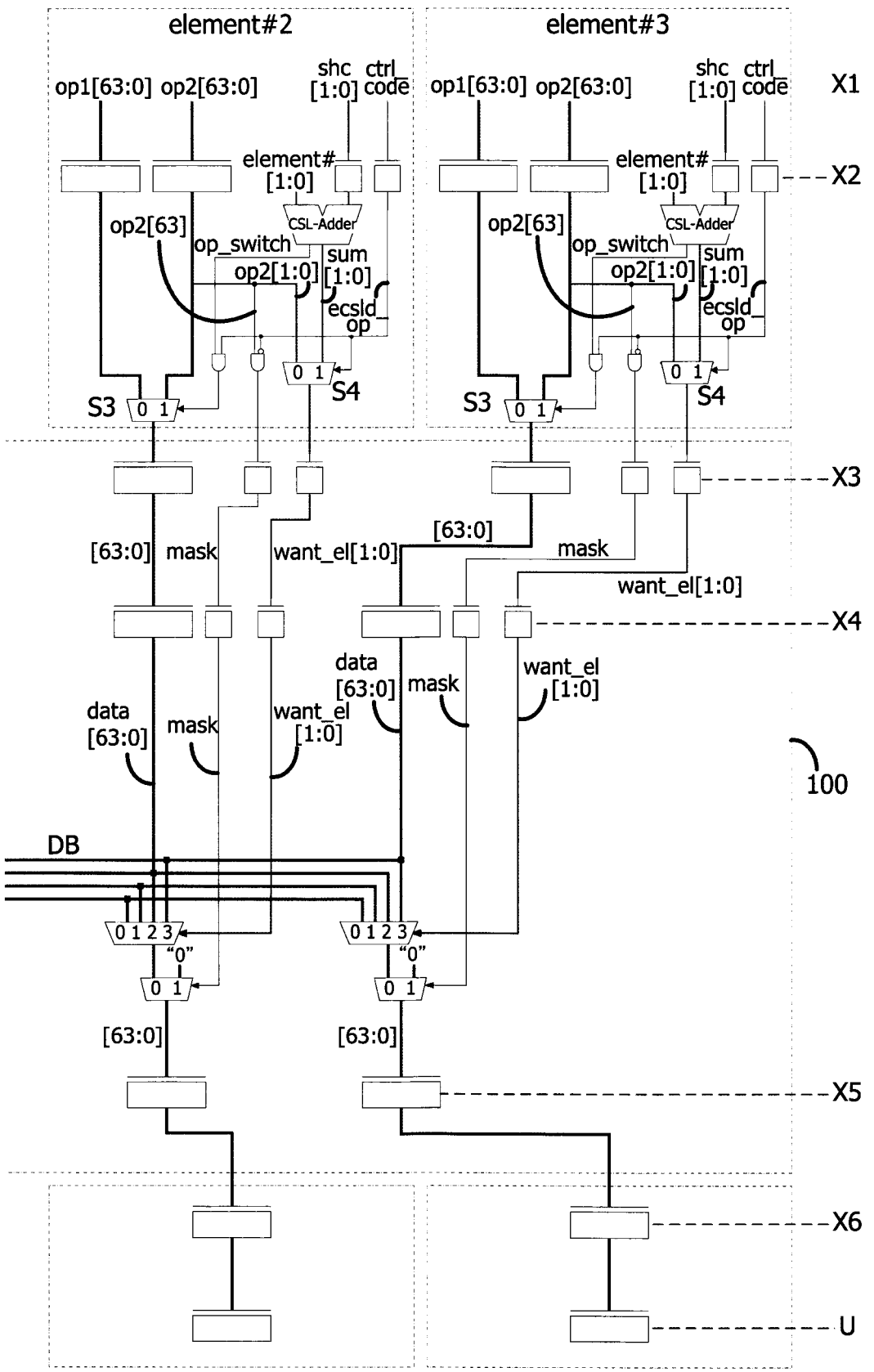
FIG. 7B is a diagram depicting the right half of the arithmetic circuit AL10-2 that performs element concatenate shift left.

FIG. 7A is a diagram depicting the left half of the arithmetic circuit AL10-2 that performs element concatenate shift left. FIG. 7B is a diagram depicting the right half of the arithmetic circuit AL10-2 that performs element concatenate shift left. The arithmetic circuit AL10-2 has a function of concatenating data of the elements and shifting the data to the left generally explained with reference to FIG. 3. In the arithmetic circuit AL10-2 depicted in FIGS. 7A and 7B, in addition to the components of the full element permutation arithmetic circuit AL10-1 depicted in FIGS. 6A and 6B, the element circuits element #0 to element #3 include, in an input circuit INPUT, adders for element concatenate shift left CSL_Adder that receive inputs of a control code ctrl_code, shift amount data shc[1:0], and an own element number element #[1:0] and subtract the shift amount data shc[1:0] from the own element number element #[1:0] or add the shift amount data shc[1:0] to the own element number element #[1:0], switches SW1 and SW2, request element selectors S4, and operand selectors S3 that select any one of the first and second operand data op1[63:0] and op2[63:0].

When the control code ctrl_code is 1, the added configuration effectively operates and the arithmetic circuit AL10-2 functions as an arithmetic circuit that performs element concatenate shift left. When the control code is 0, the arithmetic circuit AL10-2 functions as the full element permutation arithmetic circuit depicted in FIGS. 6A and 6B.

The operation of the arithmetic circuit AL10-2 that performs element concatenate shift left is explained. When the control code ctrl_code is 1, an element concatenate shift left operation signal ecsld_op is 1, and the request element selectors S4 select a sum sum[1:0] of the adders CSL_Adder and output the sum sum[1:0] as a request element signal want_el[1:0]. The switches SW1 output an output operand switch signal op_switch as a select signal of the operand selectors S3. The operand switch signal op_switch is a borrow value that is generated when the adders CSL_Adder subtract the shift amount data shc[1:0] from the own element number element #[1:0]. The switches SW2 outputs 0, always set the mask signal mask to 0, and fix the selection of the mask selectors S2 to the output of the element data selectors S1.

FIGS. 8A to 8C are logical value tables for explaining the operation of the adders CSL_Adder. FIG. 8A is a table indicating which of the first and second operand data of which element is arranged to correspond to the own element number element #[1:0] and the shift amount data shc[1:0]. FIG. 8B is a table of a borrow value op_switch generated when the adders CSL_Adder subtracts the shift amount data shc[1:0] from the own element number element #[1:0]. FIG. 8C is a table of a sum sum[1:0] obtained by adding up the own element number element #[1:0] and the shift amount data shc[1:0].

As depicted in FIG. 8A, when the shift amount shc[1:0] is 0, the element circuit element #0, an own element number of which is 0, selects, with the selector S1, the first operand data of the element 0 and stores the first operand data. Similarly, when the shift amount shc[1:0] is 1, 2, and 3, the element circuit element #0 selects and stores the first operand data of the elements 1, 2, and 3 and stores the operand data. When the shift amount shc[1:0] is 0, 1, and 2, the element circuit element #1 selects and stores the first operand data of the elements 1, 2, and 3. When the shift amount shc[1:0] is 3, the element circuit element #1 selects and stores the second operand data of the element 0. The other element circuits element #2 and element #3 are the same as the element circuit element #1.

Subsequently, as depicted in FIG. 8A, the element circuit element #0 selects, according to the selectors S3, the first or second operand data according to a borrow value after subtraction. For example, when the shift amount is 0, since borrow=0, the element circuit element #0 selects the first operand data op1. When the shift amount is 1, 2, and 3, since borrow=1, the element circuit element #0 selects the second operand data opt. The other element circuits are the same.

On the other hand, as depicted in FIG. 8C, when the shift amount is 0 to 3, the element circuit element #0 respectively selects data of the element circuits element #0 to element #3 according to the sum sum[1:0]. The selection is performed by the element data selectors S1. The other element circuits are the same. Note that a sum in FIG. 8C is the same as an element number selected in FIG. 8A.

Therefore, the element concatenate shift left arithmetic circuit AL10-2 depicted in FIGS. 7A and 7B operates as explained below when FIGS. 8A, 8B, and 8C are referred to as well. First, when the shift amount is 0, in the element circuits element #0 to element #3, the operand selectors S3 select the first operand data op1 according to the operand switch signal op_switch=0000, which is a borrow value. The element data selectors S1 respectively select the element circuits element #0, element #1, element #2, and element #3 according to the sum sum=0123.

When the shift amount is 1, according to the operand switch signal op_switch=1000, which is a borrow value, the operand selector S3 of the element circuit element #0 selects the second operand data opt. The operand selectors S3 of the element circuits element #1 to element #3 select the first operand data op1. The element data selectors S1 of the element circuits element #0 to element #3 respectively select element circuits element #1, element #2, element #3, and element #0 according to the sum sum=1230. In this case, the second operand data opt of element #0 is selected by the element circuit element #3.

Similarly, when the shift amount is 2, according to the operand switch signal op_switch=1100, which is a borrow value, the operand selectors S3 of the element circuits element #0 and element #1 select the second operand data opt. The operand selectors S3 of the element circuits element #2 and element #3 select the first operand data op1. The element data selectors S1 of the element circuits element #0 to element #3 respectively select data of the element circuits element #2, element #3, element #0, and element #1 according to a sum=2301. In this case, the second operand data opt of the elements #0 and #1 is selected by the element circuit element #2 and element #3.

The same applies when the shift amount is 3.

In the element concatenate shift left arithmetic circuit AL10-2, since the selection signal masks of the mask selectors S2 are always fixed to 0 according to a control code ctrl_code=1, the mask function does not work. Therefore, the most significant bit op2[63] and the least significant 2 bits op2[1:0] of the second operand data opt do not have the mask function and the selection function. In the element concatenate shift left arithmetic circuit AL10-2, the element concatenate shift left function is realized mainly by the operand selectors S3 and the element data selectors S1.

The element concatenate shift left arithmetic circuit depicted in FIGS. 7A and 7B plays the element concatenate shift left function explained with reference to FIG. 3 using the operand selectors S3 and the data bus DB of the full element permutation arithmetic circuit AL10-1 depicted in FIGS. 6 and 7 and the operand selectors S3 added in FIGS. 7A and 7B. In the element concatenate shift left function, in any shift amount, data stored in the result elements of the elements is first or second operand data. Therefore, the first or second operand data is selected by the operand selectors S3 at the pre-stage of the selector section 100 to reduce data buses for sending to the element data selectors S1 in the selector section 100. The shift operation is performed by the data bus DB and the element data selectors S1 to reduce shift circuits needed anew.

[Element Sum Mask Arithmetic Circuit AL10-3]

Figure 9A:
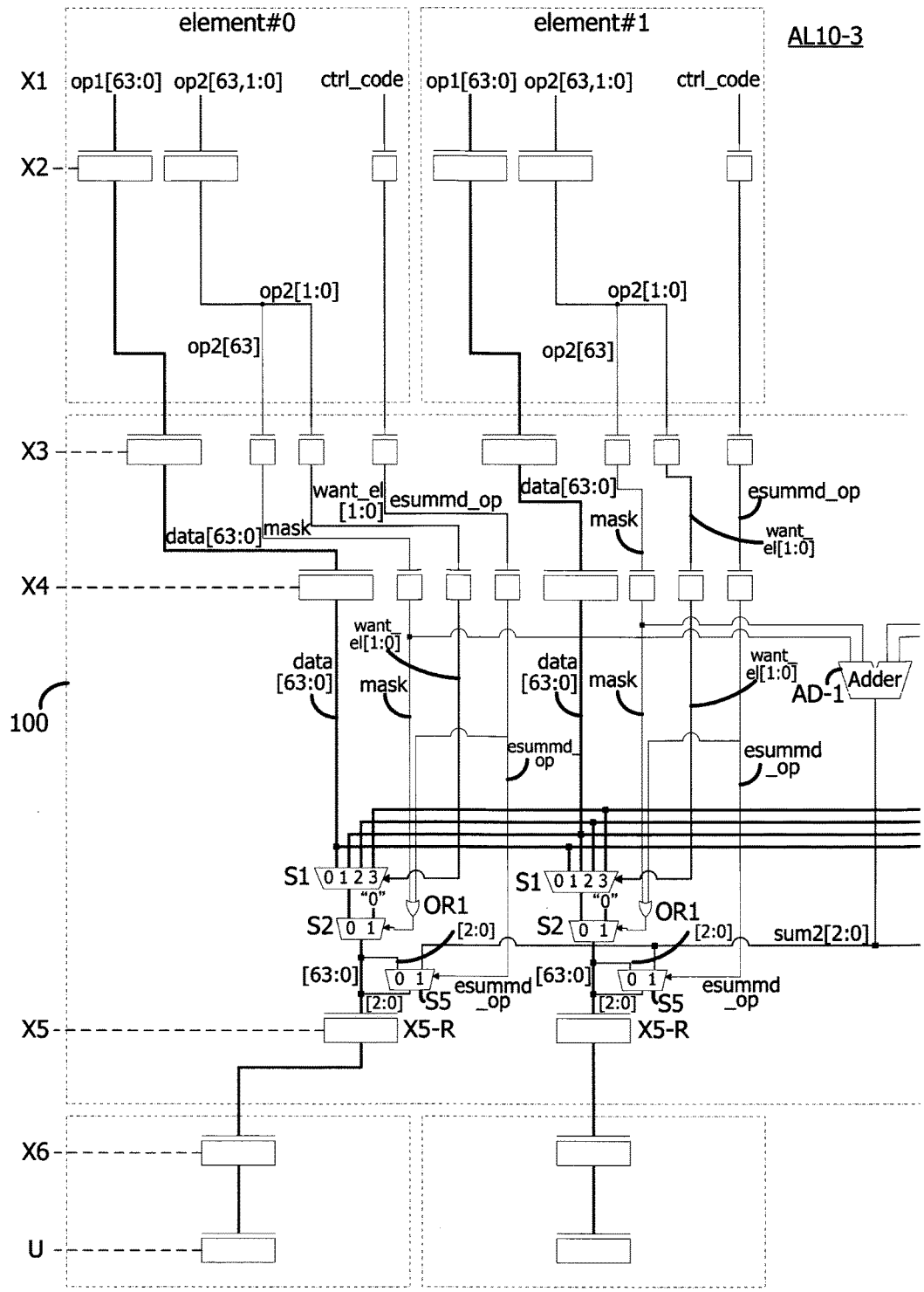
FIG. 9A is a diagram depicting the left half of the arithmetic circuit AL10-3 that performs element sum mask.
Figure 9B:
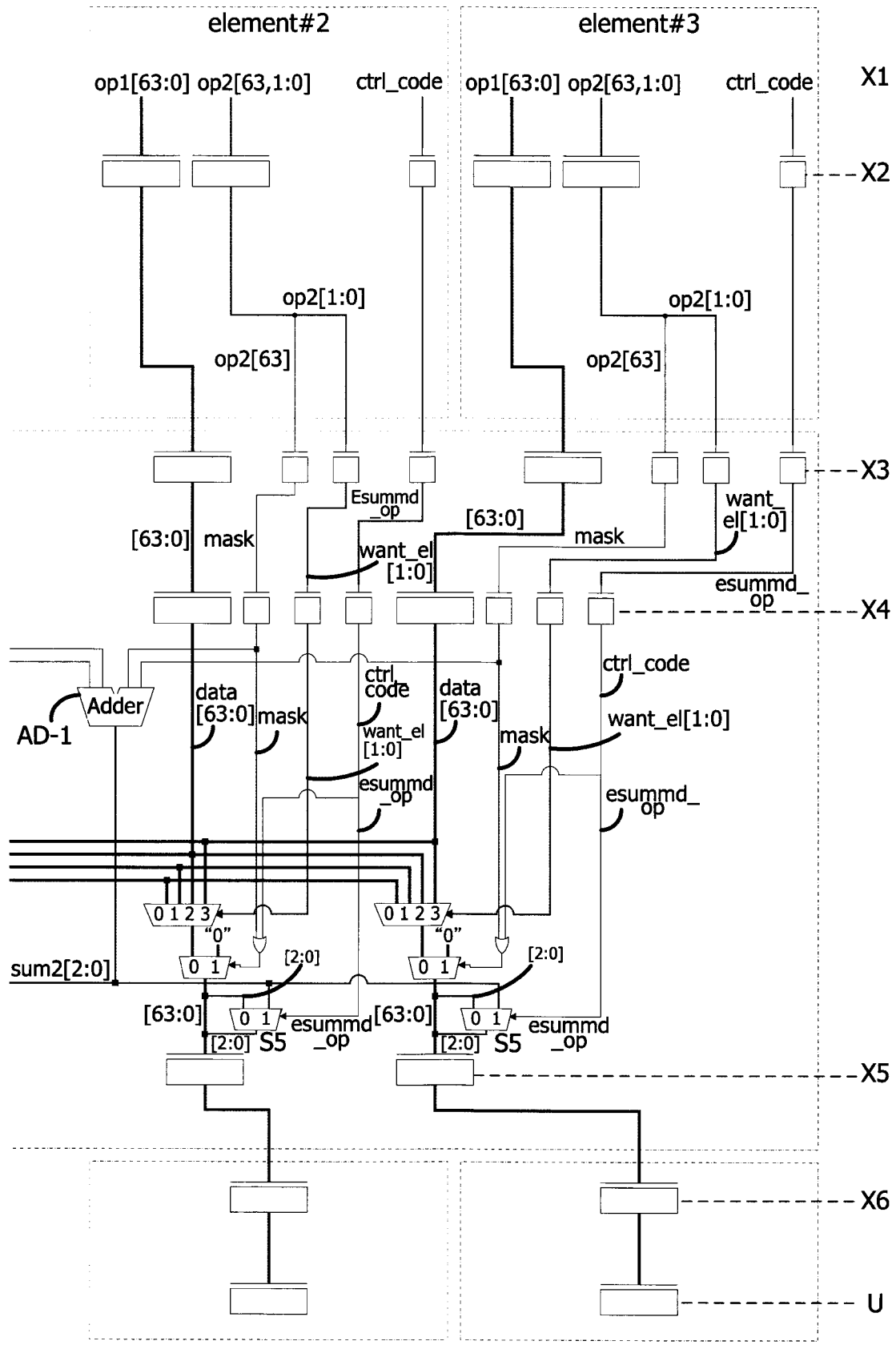
FIG. 9B is a diagram depicting the right half of the arithmetic circuit AL10-3 that performs element sum mask.

FIG. 9A is a diagram depicting the left half of the arithmetic circuit AL10-3 that performs element sum mask. FIG. 9B is a diagram depicting the right half of the arithmetic circuit AL10-3 that performs element sum mask. The arithmetic circuit AL10-3 has a function of adding up the valid bits of the elements and storing the valid bits in all the elements generally explained with reference to FIG. 4. In the arithmetic circuit AL10-3 depicted in FIGS. 9A and 9B, in addition to the components of the full element permutation arithmetic circuit AL10-1 depicted in FIGS. 6A and 6B, the selector section 100 includes the valid bit adder AD-1, sum selectors S5 that select a sum sum2[2:0] of the valid bit adder AD-1 according to the control code ctrl_code=1 and an element sum mask operation signal esummd_op=1, and OR gates OR1 to which the mask signal mask and the element sum mask operation signal esummd_op are input. The mask selectors S2 select all-zero data "0" according to the element sum mask operation signal esummd_op=1 supplied via the OR gates OR1.

When the control code ctrl_code is 1, the arithmetic circuit AL10-3 functions as an arithmetic circuit that performs element sum mask. When the control code ctrl_code is 0, the arithmetic circuit AL10-3 functions as the full element permutation arithmetic circuit depicted in FIGS. 6A and 6B.

When the control code ctrl_code is 1, the arithmetic circuit AL10-3 functions as the element sum mask arithmetic circuit AL10-2. In that case, the first operand data op1 and the least significant 2 bits op2[1:0] of the second operand data are not used. Only the most significant bit op2[63] of the second operand data is used as a bit representing validity of the elements. Accordingly, the request element signal want_el[1:0] of the least significant 2 bits op2[1:0] does not function. The element sum mask signal esummd_op=1 supplied via the OR gates OR1 is supplied to the mask selectors S2. The mask selectors S2 select the all-zero data "0" irrespective of the mask signal mask. The mask function is made effective. According to the element sum mask operation signal esummd_op=1, the sum selectors S5 overwrite the all-zero data "0" with the sum sum2[2:0] of the valid bit adder AD-1.

Note that the sum selectors S5 that overwrite the sum may be provided in the pre-stage of input terminals of the all-zero data of the mask selectors S2. In that case, the mask selectors S2 select inputs obtained by overwriting the all-zero data with the sum sum2[2:0] of the valid bits and outputs the inputs to the X5 registers X5-R.

As explained above, when the arithmetic circuit AL10-3 functions as the element sum mask arithmetic circuit AL10-2, the element data selectors S1 do not function. However, the mask selectors S2 always have the mask function due to esummd_op=1 (ctrl_code=1). The additionally provided sum selectors S5 select the sum sum2[2:0] of the valid bit adder AD-1 and overwrite least significant 3 bits of the all-zero data with the sum sum2[2:0]. Data of 63 bits including the sum sum2[2:0] is output to the X5 registers X5-R. Therefore, the arithmetic circuit depicted in FIGS. 9A and 9B realizes the element sum mask function using the mask selectors S2 of the full element permutation arithmetic circuit depicted in FIGS. 6A and 6B and the added sum selectors S5.

[Element Compress Arithmetic Circuit AL10-4]

Figure 10A:
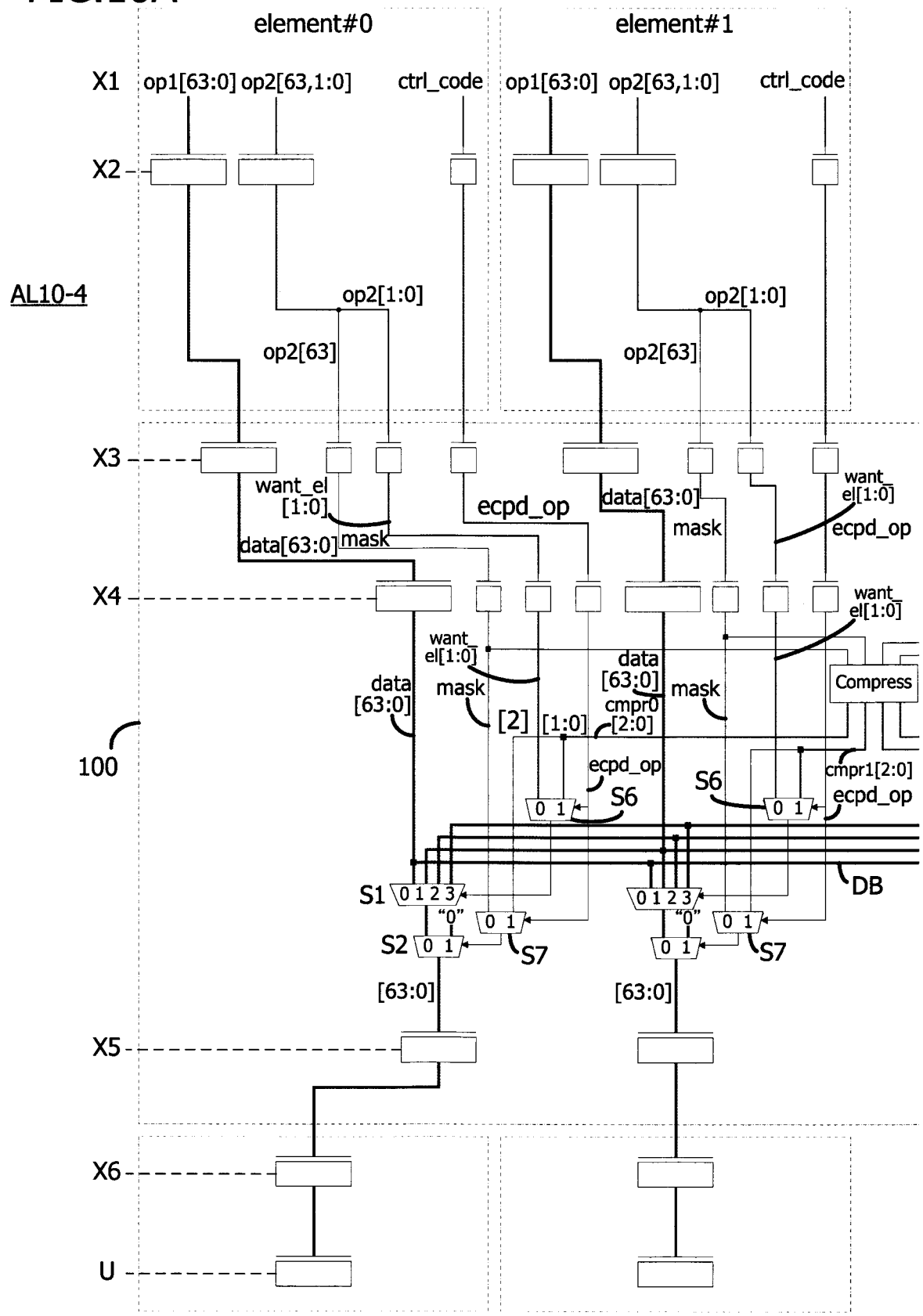
FIG. 10A is a diagram depicting the left half of the arithmetic circuit AL10-4 that performs element compression.
Figure 10B:
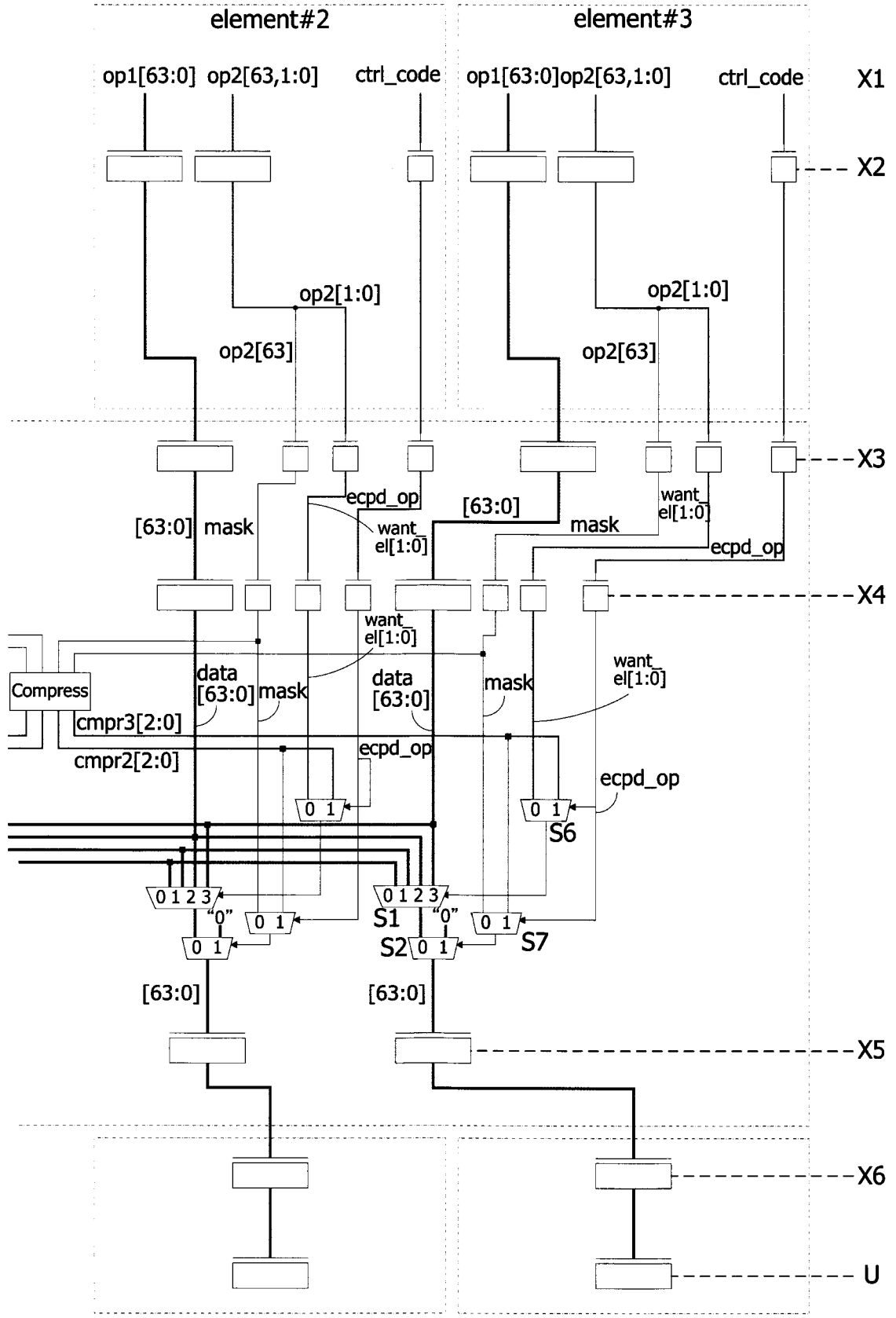
FIG. 10B is a diagram depicting the right half of the arithmetic circuit AL10-4 that performs element compression.

FIG. 10A is a diagram depicting the left half of the arithmetic circuit AL10-4 that performs element compression. FIG. 10B is a diagram depicting the right half of the arithmetic circuit AL10-4 that performs element compression. The arithmetic circuit AL10-4 has a function of collecting the data of the valid elements in the elements on the left side generally explained with reference to FIG. 5 and storing the data of the valid elements. In the arithmetic circuit AL10-4 depicted in FIGS. 10A and 10B, in addition to the components of the full element permutation arithmetic circuit AL10-1 depicted in FIGS. 6A and 6B, the selector section 100 includes a compress decoder Compress and first and second compress selectors S6 and S7.

When the control code ctrl_code is 1, the arithmetic circuit AL10-4 functions as an arithmetic circuit that performs compression of element data. When the control code is 0, the arithmetic circuit AL10-4 functions as the full element permutation arithmetic circuit depicted in FIGS. 6A and 6B.

When the control code ctrl_code is 1, an element compression operation signal ecpd_op=1. The first and second compress selectors S6 and S7 respectively select decode signals cmpr #[1:0] and cmpr #[2] of the compress decoder Compress. Therefore, the least significant 2 bits op2[1:0] of the second operand data are not used by the selector S6, and the most significant bit op2[63], that is input to the compress decoder Compress functions as a valid bit of the elements.

The compress decoder Compress generates, according to combinations of the valid bit, four decode signals cmpr[2:0] to be respectively output to the four elements. The decode signal cmpr #[2] is a signal indicating whether data is masked. The decode signal cmpr #[1:0] is a signal indicating which element data is selected.

The second compress selectors S7 select the decode signal cmpr #[2] rather than the mask signal mask, which is op2[63]. Further, the first compress selectors S6 select the decode signal cmpr #[1:0] rather than the request element signal want_el[1:0]. Accordingly, the element data selectors S1 select element data based on the decode signal cmpr

[1:0]. The mask selectors S2 select the all-zero data according to the decode signal cmpr #[2].

FIGS. 11A to 11D are diagram depicting logical value tables of the compress decoder Compress. In FIGS. 11A to 11D, logical value tables of decoders with respect to the elements #0 to #3 are depicted. "X" in the logical value tables indicates 1 or 0.

For example, in a decoder of the element #0, when a valid bit of the element #0 is 1 (el #0=1), decode signals cmpr0[2]=0 and cmpr[1:0]=00. The decoder selects data of the element #0 and stores the data in the result register R3. Similarly, when the valid bit of the element #0 is 0 and a valid bit of the element #1 is 1 (el #0=0, el #1=1), the decode signals cmpr0[2]=0 and cmpr[1:0]=01. The decoder selects data of the element #1 and stores the data in the result register R3. When el #0=0, el #1=0, and el #2=1 and when el #0=0, el #1=0, and el #2=0, el #3=1, the decoder respectively selects data of the element #2 and data of the element #3. Otherwise (default), the decode signal cmpr0[2]=1, and the all-zero data "0" is output to the result register R3. Decoders of the other elements #1, #2, and #3 are the same and be able to be understood from the logical value tables in FIGS. 15A to 15D 11A to 11D. Therefore, explanation of the decoders is omitted.

As explained above, the arithmetic circuit depicted in FIGS. 10A and 10B realizes an element compressing function using the element data selectors S1, the mask selectors S2, the database DB of the full element permutation arithmetic circuit depicted in FIGS. 6A and 6B, and the compress decoder Compress and the first and second compress selectors S6 and S7.

[Arithmetic Circuit Having all the Functions]

The four kinds of arithmetic circuits in this embodiment are explained above. In the above explanation, the combinations of the full element permutation arithmetic circuit AL10-1, the element concatenate shift left arithmetic circuit AL10-2, the element sum mask arithmetic circuit AL10-3, and the element compress arithmetic circuit AL10-4 are explained.

An arithmetic circuit having all the functions that switches the functions of the four kinds of arithmetic circuits according to control signals is explained.

Figure 12A:
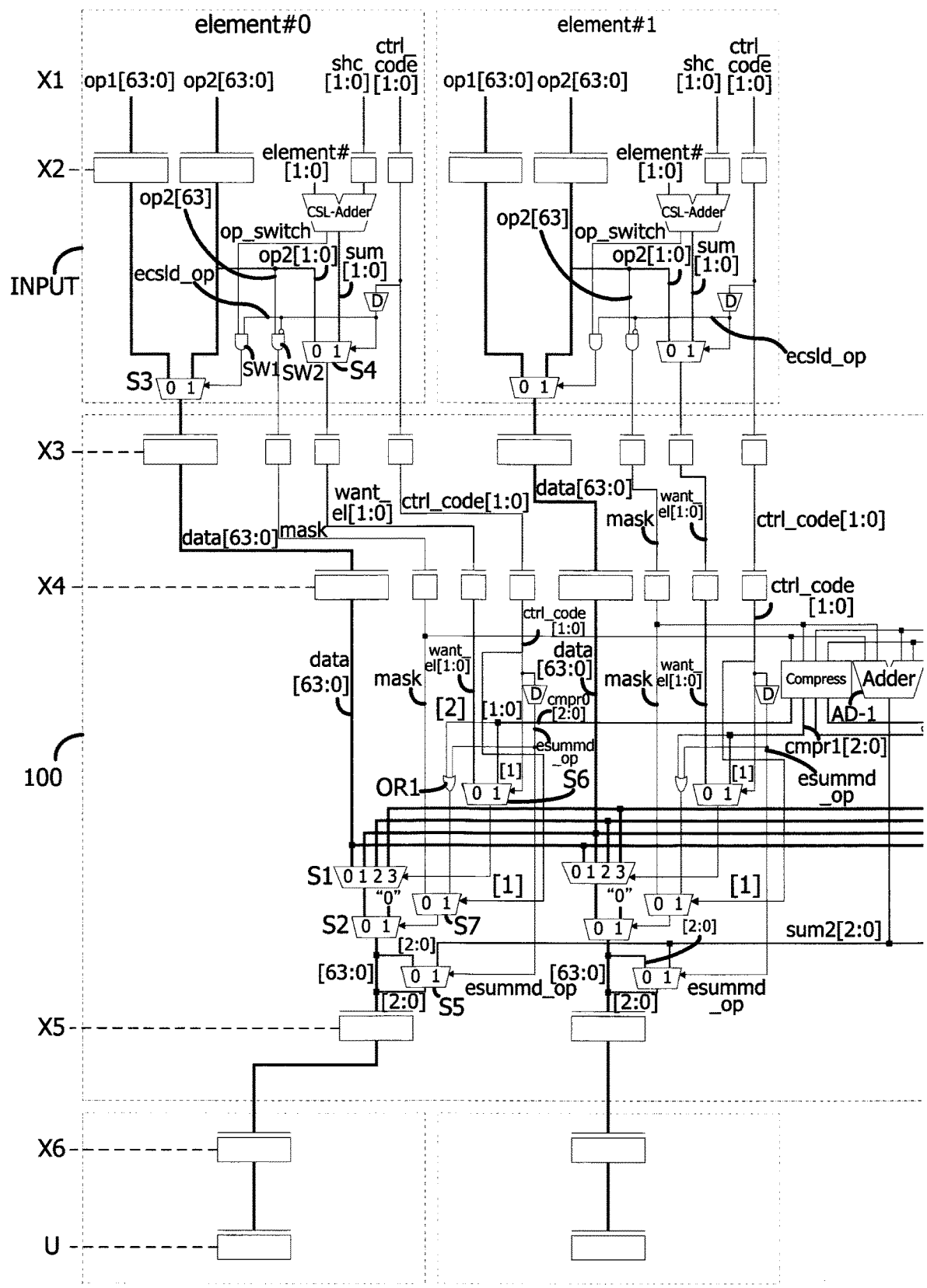
FIG. 12A is a diagram depicting the left side of the arithmetic circuit having all the functions in this embodiment.
Figure 12B:
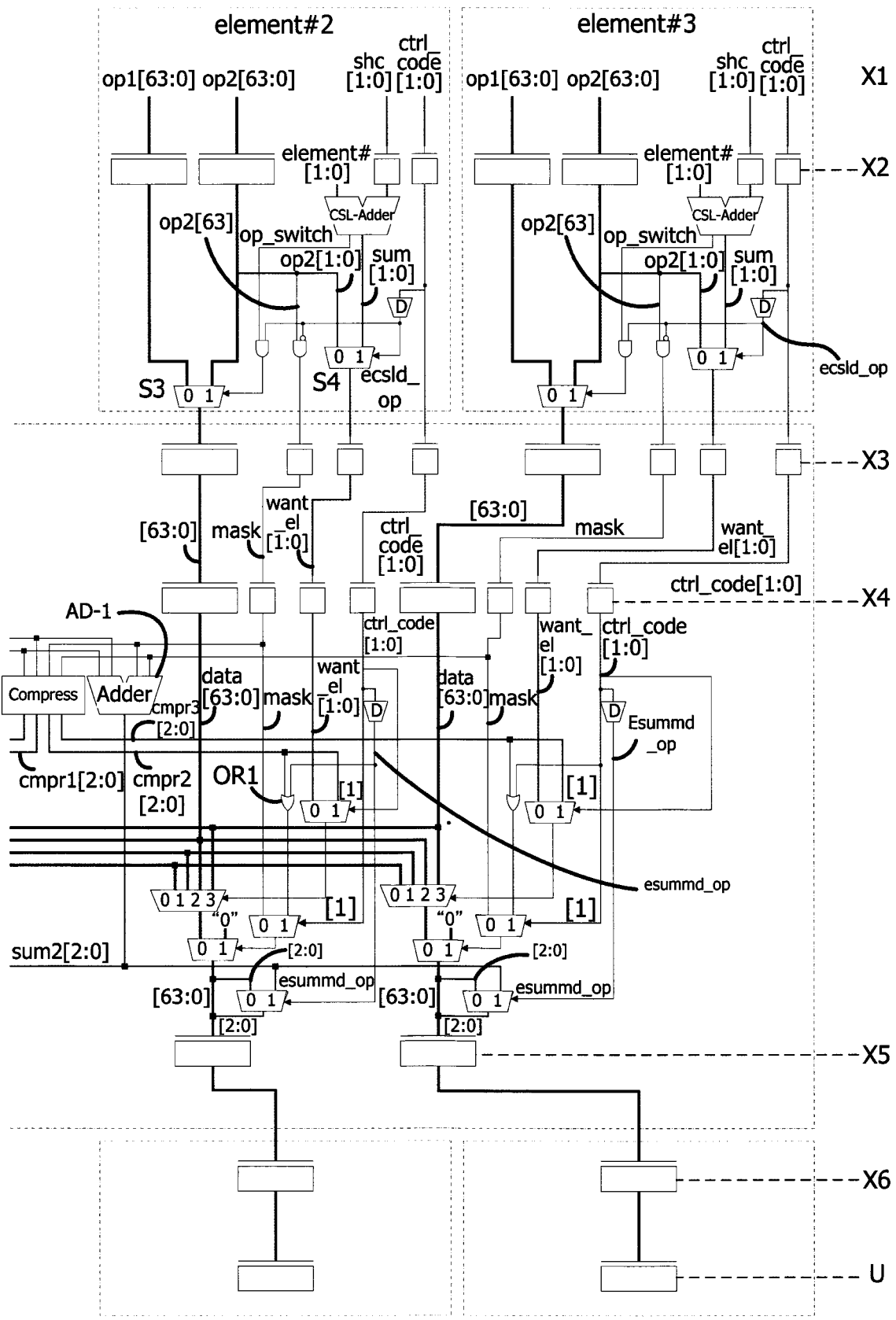
FIG. 12B is a diagram depicting the right side of the arithmetic circuit having all the functions in this embodiment.

FIG. 12A is a diagram depicting the left side of the arithmetic circuit having all the functions in this embodiment. FIG. 12B is a diagram depicting the right side of the arithmetic circuit having all the functions in this embodiment. The arithmetic circuit having all the functions depicted in FIGS. 12A and 12B is configured to be capable of switching the four kinds of functions according to the control code ctrl_code[1:0] of 2 bits. Allocation of control codes is as described below.

Control code ctrl_code[1:0]=00: Full element permutation
Control code ctrl_code[1:0]=01: Element concatenate shift left
Control code ctrl_code[1:0]=10: Element sum mask
Control code ctrl_code[1:0]=11: Element compress The arithmetic circuit having all the functions includes, in the selector section 100, the element data selectors S1, the mask selectors S2, the sum selectors S5, the first and second compress selectors S6 and S7, the valid bit adder AD-1, and the compress decoder Compress. Further, the arithmetic circuit having all the functions includes, in input sections of the element circuits element #0 to element #3, the adders for element concatenate shift left CSL_Adder, the operand selectors S3, the element selectors S4, and the switches SW1 and SW2. The arithmetic circuit having all the functions includes decoders D, one of which decodes the control code ctrl_code[1:0] and generates the element concatenate shift left operation signal ecsld_op and the other od which generates the element sum mask operation signal esummd_op. It is possible to understand, according to an output signal of the decoders D in the figure, which decoding is performed. Note that an element compress operation signal ecpd_op in FIGS. 10A and 10B is not generated, and the element compress operation signal ecpd_op and the element sum mask operation signal esummd_op are substituted by the high-order bit [1] of the control code ctrl_code[1:0].

When the control code ctrl_code[1:0]=00, the arithmetic circuit having all the functions operates as an arithmetic circuit that performs full element permutation. Since the control code is "00", all the additional selectors S3 to S7 select a selection signal "0" side. As a result, the arithmetic circuit functions as the full element permutation arithmetic circuit AL10-1 depicted in FIGS. 6A and 6B.

When the control code ctrl_code[1:0]=01, the arithmetic circuit having all the functions operates as an arithmetic circuit that performs element concatenate shift left. Since the control code is "01", the element concatenate shift left operation signal ecsld_op is 1. The request element selectors S4 select the sum sum[1:0] of an adder on a "1" side. The switches SW1 output the borrow value op_switch of the adder to the operand selectors S3. The switches SW2 set the mask signal mask to "0". According to the high-order bit ctrl_code[1]=0 of the control code, the sum selectors S5 select "0". The first and second compress selectors S6 and S7 respectively select the mask signal mask and the request element signal want_el[1:0] on a "0" side. As a result, the arithmetic circuit operates as the element concatenate shift left arithmetic circuit AL10-2 depicted in FIGS. 7A and 7B.

When the control code ctrl_code[1:0]=10, the arithmetic circuit having all the functions operates as an arithmetic circuit that performs element sum mask. The control code is "10", the element sum mask operation signal esummd_op is "1", the high-order bit ctrl_code[1] of the control code=1, and all of the selectors S5, S6, and S7 selects the "1" side. An element concatenate left shift operation signal ecsld_op=0, an output of the switches SW1 is 0, and the selectors S3 selects the "0" side. An output of the switches SW2 is a valid bit op2[63]. The selectors S4 output a request element bit op2[1:0]. As a result, the arithmetic circuit operates as the element sum mask arithmetic circuit AL10-3 depicted in FIGS. 9A and 9B.

Note that, unlike the arithmetic circuit depicted in FIGS. 9A and 9B, the selectors S6 select the "1" side and output a decode signal cmpr[1:0] of the compress decoder. The element data selectors S1 select data of the elements on the basis of the decode signal cmpr[1:0]. However, since the OR gate OR1 outputs "1" according to the element sum mask operation signal esummd_op=1 and the selectors S7 select the output "1" of the OR gate according to the high-order bit ctrl_code[1] of the control code=1, the mask selectors S2 mask the all-zero data "0". Thereafter, the selectors S5 select a valid bit sum sum2[2:0] according to a request sum mask operation signal esummd_op1 and overwrite the data with the valid bit sum.

That is, an element request signal want_el[1:0] by the selectors S6 is not questioned during Element Sum Mask. Therefore, if the high-order bit ctrl_code of the control code=1 (in the case of Element Sum Mask or Element Compress), it is possible to reduce a circuit such as a decoder for generating the element compress operation signal ecpd_op by selecting the "1" side of the selectors S6.

Finally, when the control code ctrl_code[1:0]=11, the arithmetic circuit having all the functions operates as an arithmetic circuit that performs element compression. The control code is "11", the element sum mask operation signal esummd_op=0, the high-order bit ctrl_code[1] of the control code=1, the selectors S5 select the "0" side, and the selectors S6 and S7 select the "1" side. The element concatenate shift left operation signal ecsld_op=0, the output of the switches SW1 is 0, and the selectors S3 select the "0" side. The output of the switches SW2 is the valid bit op2[63] and the selectors S4 output the request element bit op2[1:0] As a result, the arithmetic circuit operates as the element compress arithmetic circuit AL10-4 depicted in FIGS. 10A and 10B.

As explained above, according to this embodiment, the processor including the three or more SIMD arithmetic elements includes the inter-element arithmetic circuit AL10 that traverses the plurality of SIMD arithmetic elements. The inter-element arithmetic circuit AL10 is configured to be capable of switching, according to the control code, replacement, transfer, and compression of data among a large number of SIMD arithmetic elements and the arithmetic function such as totalization of sums of data. Therefore, it is possible to make the most of high-speed processing of the SIMD operator.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An arithmetic circuit comprising:
   first to N-th, N being an integer equal to or larger than two, element circuits each of which includes:
      input circuits configured to input first operand data and second operand data; and
      an element data selector configured to select the first operand data or the second operand data of any one of the first to N-th element circuits on the basis of a request element signal; and
   a data bus, provided in common to the first to N-th element circuits, configured to supply the first operand data or the second operand data input by each of the first to N-th element circuits to the element data selector of each of the first to N-th element circuits, wherein:
   each of the first to N-th element circuits has a corresponding element number,
   each of the first to N-th element circuits includes:
      an operand selector configured to:
         select, when a control signal is in a first state, the first operand data to output to the data bus, and
         select, when the control signal is in a second state, on the basis of an operand switch signal that indicates whether or not a shift amount, which is common for the first to N-th element circuits, is larger than the corresponding element number, the first operand data or the second operand data to output to the data bus, and
      the element data selector in each of the first to N-th element circuits:
         selects, when the control signal is in the first state, on the basis of a first request element signal included in the second operand data, the first operand data of any one of the first to N-th element circuits, and
         selects, when the control signal is in the second state, on the basis of a second request element signal that is generated by adding the corresponding element number to the shift amount, the first operand data or the second operand data selected by the operand selector of any one of the first to N-th element circuits.

2. The arithmetic circuit according to claim 1, further comprising:
   a valid bit adder configured to add up, when the control signal is in a third state, valid bits included in the second operand data input by the first to N-th element circuits, wherein each of the first to N-th element circuits includes a sum selector configured to output, when the control signal is in the third state, a sum output by the valid bit adder instead of a part of an output of the corresponding element data selector.

3. The arithmetic circuit according to claim 2, wherein:
   each of the first to N-th element circuits includes a mask selector configured to select output of the corresponding element data selector or all-zero data,
   the arithmetic circuit further comprises a compress decoder configured to generate, when the control signal is in a fourth state, on the basis of valid bits included in the second operand data input by each of the first to N-th element circuits, compress decode signals each of which includes a mask signal and an element data selection signal for each of the first to N-th element circuits, and
   each of the first to N-th element circuits includes:
      a first compress selector configured to select, when the control signal is in the fourth state, the corresponding element data selection signal, instead of the request element signal; and
      a second compress selector configured to output the corresponding mask signal to the corresponding mask selector and cause the corresponding mask selector to select the all-zero data.

4. The arithmetic circuit according to claim 1, wherein:
   each of the first to N-th element circuits includes a mask selector configured to select output of the corresponding element data selector or all-zero data,
   the arithmetic circuit further comprises a compress decoder configured to generate, when the control signal is in a fourth state, on the basis of valid bits included in the second operand data input by each of the first to N-th element circuits, compress decode signals each of which includes a mask signal and an element data selection signal for each of the first to N-th element circuits, and
   each of the first to N-th element circuits includes:
      a first compress selector configured to select, when the control signal is in the fourth state, the corresponding element data selection signal, instead of the request element signal; and
      a second compress selector configured to output the corresponding mask signal to the corresponding mask selector and cause the corresponding mask selector to select the all-zero data.

5. The arithmetic circuit according to claim 1, wherein the first to N-th element circuits are first to N-th Single Instruction Multiple Data (SIMD) arithmetic elements respectively including:
   a first operand register to which the first operand data is input;

a second operand register to which the second operand data is input;

an arithmetic operator configured to receive inputs of the first operand data and second operand data and perform an arithmetic operation on the first operand data and second operand data; and a result register configured to store an arithmetic result output by the arithmetic operator.

6. A control method for an arithmetic circuit including:

first to N-th, N being an integer equal to or larger than two, Single Instruction Multiple Data (SIMD) arithmetic elements each of which includes:

a first operand register to which first operand data is input;

a second operand register to which second operand data is input;

an arithmetic operator configured to receive inputs of the first operand data and the second operand data and perform an arithmetic operation on the first operand data and the second operand data;

a result register configured to store an arithmetic result output by the arithmetic operator; and an element data selector configured to select the first operand data or the second operand data of any one of the first to N-th SIMD arithmetic elements on the basis of a request element signal; and a data bus, provided in common to the first to N-th SIMD arithmetic elements, configured to supply the first operand data or the second operand data input by each of the first to N-th SIMD arithmetic elements to the element data selector of each of the first to N-th SIMD arithmetic elements, the control method comprising:

an operand selector in each of the first to N-th SIMD arithmetic elements:

selecting when a control signal is in a first state, the first operand data to output to the data bus, and selecting, when the control signal is in a second state, on the basis of an operand switch signal that indicates whether or not a shift amount, which is common for the first to N-th SIMD arithmetic elements, is larger than a corresponding element number that each of the first N-th SIMD arithmetic elements has, the first operand data or the second operand data to output to the data bus, and the element data selector in each of the first to N-th SIMD arithmetic elements:

selecting, when the control signal is in the first state, on the basis of a first request element signal included in the second operand data, the first operand data of any one of the first to N-th SIMD arithmetic elements, and selecting, when the control signal is in the second state, on the basis of a second request element signal that is generated by adding the corresponding element number to the shift amount, the first operand data or the second operand data selected by the operand selector of any one of the first to N-th SIMD arithmetic elements.

* * * * *